(12) United States Patent
Liu et al.

(10) Patent No.: US 11,593,022 B2
(45) Date of Patent: Feb. 28, 2023

(54) SYSTEM, METHOD. AND ELECTRONIC DEVICE FOR CLOUD-BASED CONFIGURATION OF FPGA CONFIGURATION DATA

(71) Applicant: ALIBABA GROUP HOLDING LIMITED, Grand Cayman (KY)

(72) Inventors: Xiang Liu, Hangzhou (CN); Xin Long, Hangzhou (CN)

(73) Assignee: ALIBABA GROUP HOLDING LIMITED, Grand Cayman (KY)

(*) Notice: Subject to any disclaimer, the term of this patent is extended or adjusted under 35 U.S.C. 154(b) by 0 days.

(21) Appl. No.: 17/419,810

(22) PCT Filed: Jan. 2, 2020

(86) PCT No.: PCT/CN2020/070057
§ 371 (c)(1),
(2) Date: Jun. 30, 2021

(87) PCT Pub. No.: WO2020/143520
PCT Pub. Date: Jul. 16, 2020

(65) Prior Publication Data
US 2022/0066690 A1    Mar. 3, 2022

(30) Foreign Application Priority Data
Jan. 7, 2019  (CN) .......................... 201910012890.0

(51) Int. Cl.
*G06F 13/28* (2006.01)
*G06F 3/06* (2006.01)

(52) U.S. Cl.
CPC .......... *G06F 3/0655* (2013.01); *G06F 3/0604* (2013.01); *G06F 3/067* (2013.01); *G06F 13/28* (2013.01); *G06F 2213/28* (2013.01)

(58) Field of Classification Search
CPC ........ G06F 21/76; G06F 30/34; G06F 30/343; G06F 30/347; G06F 9/30098;
(Continued)

(56) References Cited

U.S. PATENT DOCUMENTS

| | | | |
|---|---|---|---|
| 2007/0214117 A1 | 9/2007 | Shu | |
| 2008/0186052 A1* | 8/2008 | Needham | ......... H03K 19/17758 326/38 |

(Continued)

FOREIGN PATENT DOCUMENTS

| | | | |
|---|---|---|---|
| CN | 102880680 A | 1/2013 | |
| CN | 108616592 A | 10/2018 | |

(Continued)

OTHER PUBLICATIONS

International Search Report to corresponding International Application No. PCT/CN2020/070057 dated Apr. 20, 2020 (2 pages).
(Continued)

*Primary Examiner* — Ilwoo Park
(74) *Attorney, Agent, or Firm* — James J. DeCarlo; Greenberg Traurig, LLP

(57) ABSTRACT

Embodiments of the present invention provide a system, a method, and an electronic device for the cloud-based configuration of FPGA configuration data. The system includes a control module internal to an FPGA and a storage module external to the FPGA. The storage module is configured to store configuration data transmitted from a cloud, and the control module is configured to retrieve the configuration data from the storage module and to configure a corresponding processing unit of the FPGA according to the configuration data. In the embodiments of the present invention, the control module internal to the FPGA is provided, and configuration data is retrieved from the storage module external to the FPGA to configure the corresponding pro-
(Continued)

cessing unit of the FPGA. Accordingly, during FPGA data migration, the configuration data stored in the external storage module can be directly migrated by using a general data migration method, thereby implementing live migration of FPGA data.

20 Claims, 5 Drawing Sheets

(58) Field of Classification Search
CPC .............. G06F 9/30101; G06F 9/30105; G06F 9/3012; G06F 9/30141; G06F 13/28–30; G06F 2213/28; G06F 2213/2802; G06F 2213/2804; G06F 2213/2806; G06F 2213/2808; G06F 3/0604; G06F 3/0655; G06F 3/067
USPC ................. 326/36–39; 710/8–10, 13, 22–28; 716/16
See application file for complete search history.

(56) References Cited

U.S. PATENT DOCUMENTS

| | | | |
|---|---|---|---|
| 2017/0097910 A1* | 4/2017 | Kumar | G06F 13/404 |
| 2020/0169459 A1* | 5/2020 | Colombo | G06F 21/64 |
| 2021/0399958 A1* | 12/2021 | Johnson | H04L 41/5096 |
| 2022/0060454 A1* | 2/2022 | Atta | G06F 15/7871 |

FOREIGN PATENT DOCUMENTS

| | | |
|---|---|---|
| WO | 2018064418 A1 | 4/2018 |
| WO | 2018064419 A1 | 4/2018 |

OTHER PUBLICATIONS

European Extended Search Report to corresponding EP Application No. 20738140.1 dated Aug. 11, 2022, 11 pages (2022).

* cited by examiner

SYSTEM, METHOD, AND ELECTRONIC DEVICE FOR CLOUD-BASED CONFIGURATION OF FPGA CONFIGURATION DATA

This application is a national stage application of Int'l Appl. No. PCT/CN20/070057, filed Jan. 2, 2020, which claims the benefit of priority of Chinese Application No. 201910012890.0 filed on Jan. 7, 2019, both of which are incorporated by reference.

BACKGROUND

Technical Field

The disclosed embodiments are directed to the technical field of cloud services, and in particular, to a system, a method, and an electronic device for the cloud-based configuration of FPGA configuration data.

Description of the Related Art

A field-programmable gate array (FPGA) is a device for storing configuration data in a latched manner. In FPGA cloud products, an FPGA includes two types of data: cached data in a memory (DDR) external to the FPGA and configuration data (configuration parameters) of each processing unit (PU) in logic internal to the FPGA. In current systems, a user usually transmits configuration data to each processing unit in the logic by means of Memory-Mapped I/O (MMIO) to perform parameter configuration, and configuration data is latched in registers of each processing unit.

In current implementations of FPGAs, configuration data is distributed and latched in registers internal to the device, so when performing data migration on the device, the configuration data in the registers cannot be retrieved in real-time, and therefore live migration of FPGA data cannot be realized.

BRIEF SUMMARY

Embodiments of the present invention provide a system, a method, and an electronic device for the cloud-based configuration of FPGA configuration data, to eliminate the defect in the prior art that live migration of FPGA data cannot be implemented.

To achieve the aforementioned objective, an embodiment of the present invention provides a system for configuring FPGA configuration data comprising: a control module internal to an FPGA; and a storage module external to the FPGA, wherein: the storage module is configured to store configuration data transmitted from a cloud, and the control module is configured to retrieve the configuration data from the storage module and to configure a corresponding processing unit of the FPGA according to the configuration data.

An embodiment of the present invention further provides a method for configuring FPGA configuration data, comprising storing, by a storage module external to an FPGA, configuration data transmitted from a cloud; and retrieving, by a control module internal to the FPGA, the configuration data from the storage module and configuring a corresponding processing unit of the FPGA according to the configuration data.

An embodiment of the present invention further provides an electronic device, comprising: a memory, configured to store a program; and a processor, configured to run the program stored in the memory, to store, by a storage module external to an FPGA, configuration data transmitted from a cloud; and retrieve, by a control module internal to the FPGA, the configuration data from the storage module and configure a corresponding processing unit of the FPGA according to the configuration data.

In the system, method, and electronic device for cloud-based configuration of FPGA configuration data provided by the embodiments of the present invention, the control module is provided internal to the FPGA, to retrieve configuration data from the storage module external to the FPGA, and to configure the corresponding processing unit of the FPGA. Accordingly, during FPGA data migration, the configuration data stored in the external storage module can be directly migrated by using a general data migration method, thereby implementing live migration of FPGA data. On the one hand, system operation maintenance is facilitated. On the other hand, reconfiguration of each processing unit can be avoided after each FPGA migration, thereby reducing the workload on a user, and improving the user experience.

The above description is merely an overview of the technical solutions of the present invention. To better understand the technical means of the present invention to enable implementation according to the contents of the description and to make the aforementioned (and other) objectives, features, and advantages of the present invention comprehensible, specific embodiments of the present invention are described below.

BRIEF DESCRIPTION OF THE DRAWINGS

Other advantages and benefits will become evident to a person skilled in the art by reading the following detailed description of the disclosed embodiments. The accompanying drawings are for illustrative purposes only and do not limit the disclosed embodiments. Moreover, in the accompanying drawings, the same reference symbols are used to represent the same parts.

DETAILED DESCRIPTION

Embodiments of the present application are described below in more detail with reference to the accompanying drawings. Although the accompanying drawings show some embodiments of the present disclosure, the present disclosure may be implemented in various forms and should not be limited by the disclosed embodiments. Instead, these embodiments are provided so that the disclosure will be better understood, and the scope of the disclosure can be fully conveyed to those skilled in the art.

In existing FPGA cloud products, a user usually transmits configuration data directly to each processing unit of logic internal to an FPGA, by means of a cloud server, to perform parameter configuration. However, configuration data is distributed and latched in registers internal to the FPGA, so when performing FPGA data migration, the configuration data in the registers cannot be retrieved in real-time, and therefore live migration of FPGA data cannot be realized.

The disclosed embodiments remedy the above problems of current FPGA systems by providing a scheme for the cloud-based configuration of FPGA configuration data. Specifically, a control module configured to configure configuration data of each processing unit is provided internal to an FPGA. When a user configures configuration data of the FPGA, the configuration data is stored in a storage module external to the FPGA by means of a cloud service, and the control module retrieves the configuration data from the external storage module. The control module further configures the configuration data for each processing unit. By using the preceding configuration method for configuration data, during FPGA data migration, configuration data stored in an external storage module can be directly migrated using a general data migration method, thereby implementing live migration of FPGA data. Thus, system operation maintenance is facilitated, and reconfiguration of each processing unit can be avoided after each FPGA migration. As such, the disclosed embodiments reduce the workload of a user and improve the user experience.

The embodiments describe the technical principles of the disclosed embodiments. The following description will describe in detail the specific technical solutions of the disclosed embodiments via a plurality of embodiments.

Figure 1:
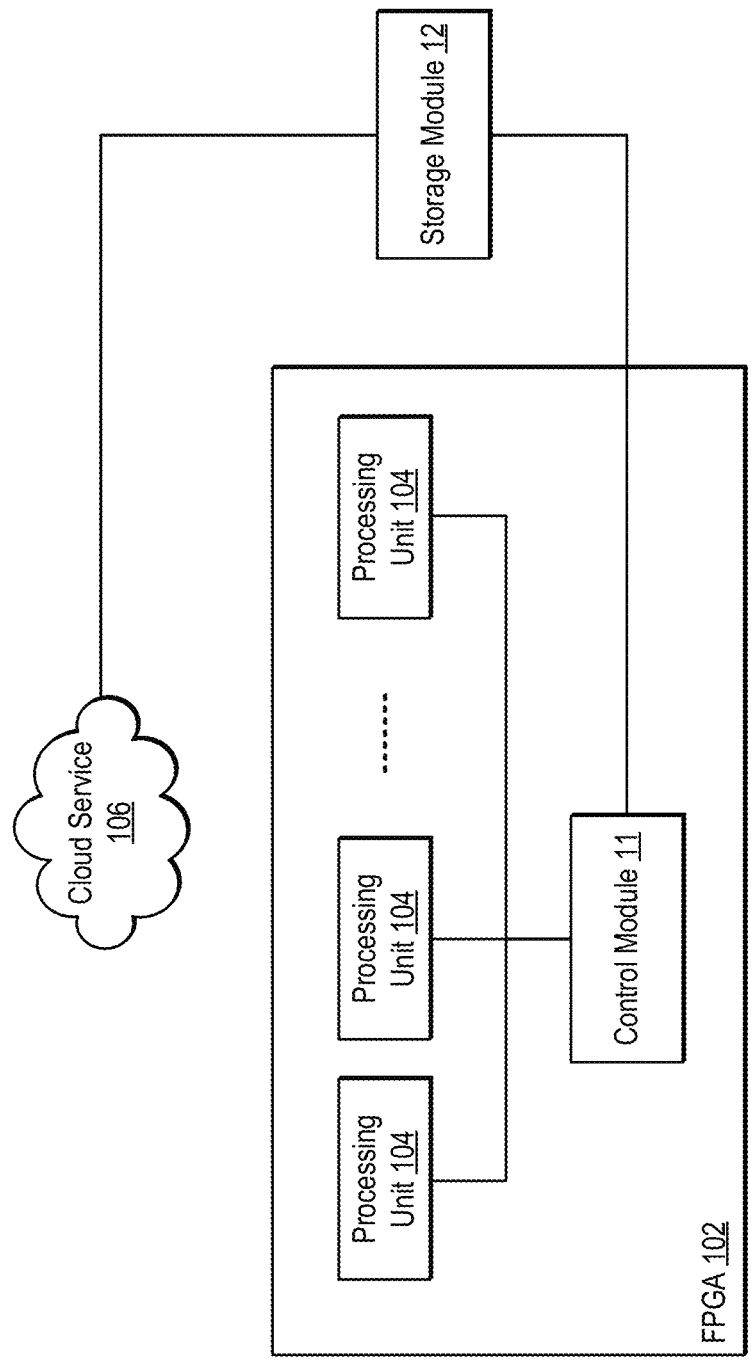
FIG. 1 is a block diagram illustrating a system for cloud-based configuration of FPGA configuration data according to some of the disclosed embodiments.

FIG. 1 is a block diagram illustrating a system 100 for cloud-based configuration of FPGA configuration data according to some of the disclosed embodiments. As shown in FIG. 1, a system for cloud-based configuration of FPGA configuration data provided that includes a control module 11 internal to an FPGA 102 and a storage module 12 external to the FPGA 102.

The storage module 12 is configured to store configuration data transmitted from a cloud service 106. Control module 11 is configured to retrieve the configuration data from the storage module 12 and to configure a corresponding processing unit 104 of the FPGA 102 according to the configuration data.

In one embodiment, to configure the FPGA 102, of which configuration data is stored in a latched manner, a user can store the configuration data in the storage module 12 external to the FPGA 102 by means of cloud service 106 first. Then, control module 11 internal to the FPGA 102 retrieves the configuration data from the storage module 12 and configures each processing unit 104 of the FPGA 102 according to the retrieved configuration data.

The illustrated embodiment provides a system 100 for cloud-based configuration of FPGA configuration data, where the control module 11 is provided internal to the FPGA 102 to retrieve configuration data from the storage module 12 external to the FPGA 102 and to configure the corresponding processing unit 104 of the FPGA 102. Accordingly, during data migration, the configuration data stored in the external storage module 12 can be directly migrated by using a general data migration method, thereby implementing live migration of FPGA data. On the one hand, system operation maintenance is facilitated. On the other hand, reconfiguration of each processing unit 104 can be avoided after each migration, thereby reducing the workload of a user, and improving the user experience.

Figure 2:
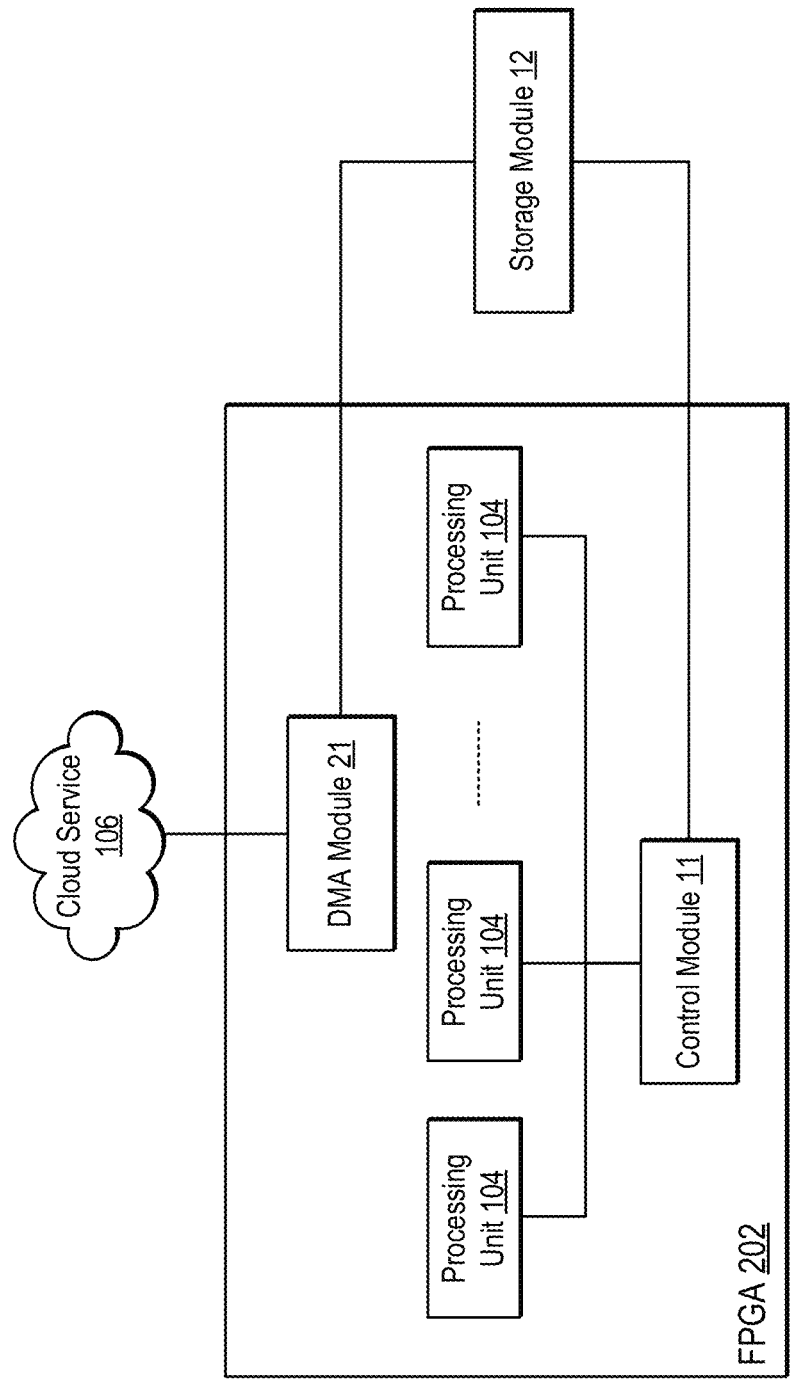
FIG. 2 is a block diagram illustrating a system for cloud-based configuration of FPGA configuration data according to some of the disclosed embodiments.

FIG. 2 is a block diagram illustrating a system 200 for cloud-based configuration of FPGA configuration data according to some of the disclosed embodiments. As shown in FIG. 2, based on the embodiment shown in FIG. 1, the control module 11 can be further configured to monitor the storage module 12 in real-time, to retrieve incremental data of the configuration data from the storage module 12, and to configure the corresponding processing unit 104 according to the incremental data of the configuration data.

In one embodiment, control module 11 can monitor a change in the configuration data in the storage module 12 in real-time. When incremental data of the configuration data is generated, control module 11 retrieves the incremental data of the configuration data from the storage module 12 in real-time and configures the corresponding processing unit 104 according to the incremental data.

In some embodiments, the configuration data can include, but is not limited to, one or more of a register address, a register value, and an attribute identifier.

In one embodiment, the configuration data can be configured to be in a common register configuration format. In such an embodiment, the register address is a space offset address of a register of the processing unit 104 internal to the FPGA 202. The register value is a value configured to the corresponding register. The attribute identifier is used to identify a read/write attribute configured to the corresponding register. For ease of management, a whole space for storing configuration data can be divided into a fixed number of address combinations, and a user determines to use one or all of them according to actual requirements.

In some embodiments, the system 200 for cloud-based configuration of FPGA configuration data provided by the embodiment of the present invention can further include a Direct Memory Access (DMA) module 21 internal to the FPGA 202. The DMA module 21 can be configured to transmit to the storage module 12, the configuration data transmitted by the user via a cloud service 106 to implement high-speed data transmission.

The illustrated embodiment provides a system 200 for cloud-based configuration of FPGA configuration data provided where a control module 11 is provided internal to the FPGA 202. Control module 11 retrieves configuration data from the storage module 12 external to the FPGA 202 and configures the corresponding processing unit 104 of the FPGA 202. Accordingly, during data migration, the configuration data stored in the external storage module 12 can be directly migrated by using a general data migration method, thereby implementing live migration of FPGA data. On the one hand, system operation maintenance is facilitated. On the other hand, reconfiguration of each processing unit can be avoided after each FPGA migration, thereby reducing the workload on a user, and improving the user experience.

Figure 3:
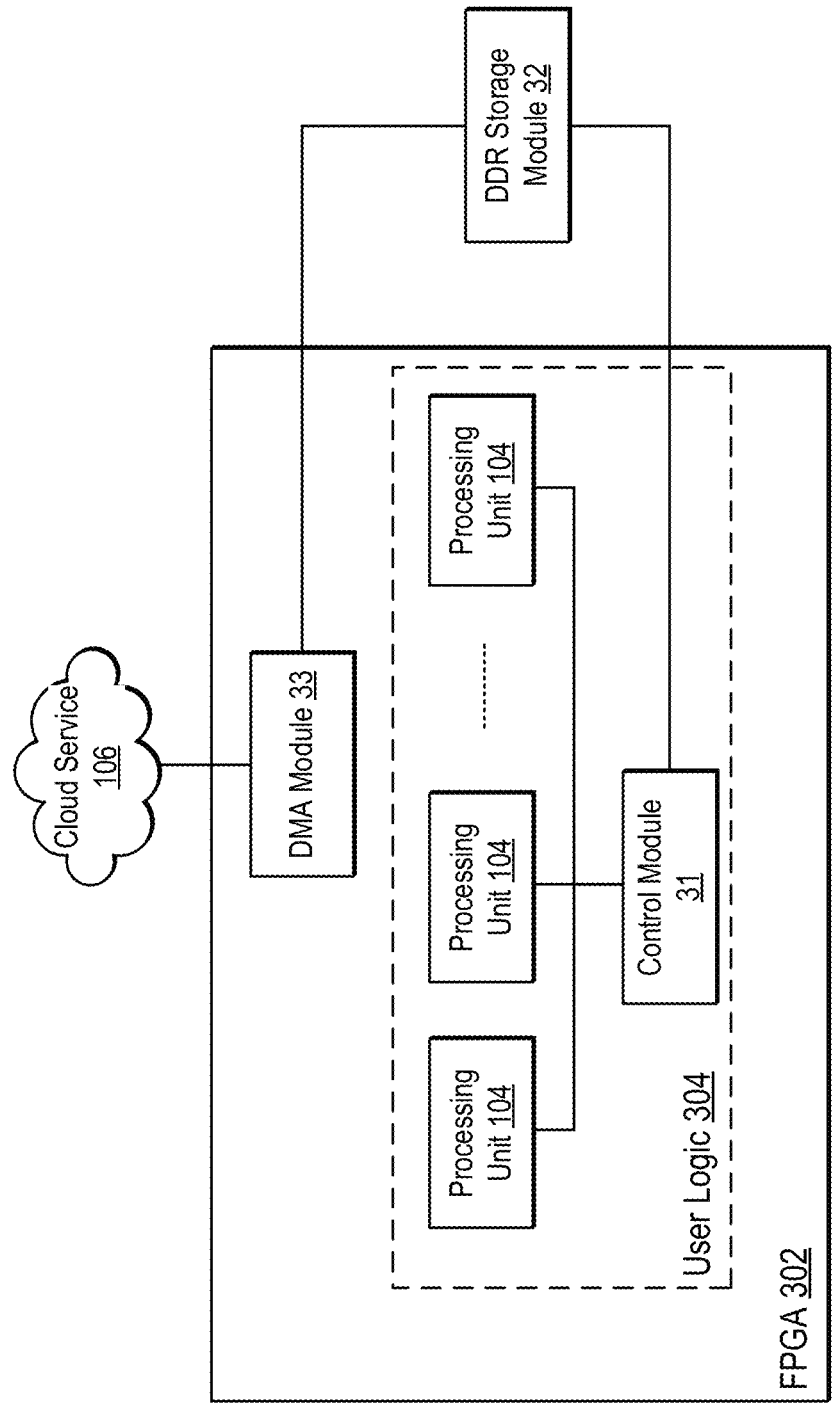
FIG. 3 is a block diagram illustrating a system for cloud-based configuration of FPGA configuration data according to some of the disclosed embodiments.

FIG. 3 is a block diagram illustrating a system 300 for cloud-based configuration of FPGA configuration data according to some of the disclosed embodiments. As shown in FIG. 3, the system 300 for cloud-based configuration of FPGA configuration data provided by the embodiment of the present invention includes a control module 31 internal to an FPGA 302 (e.g., user logic 304 that can be provided in a static region of the FPGA 302) and a DDR storage module 32 external to the FPGA 302. The DDR storage module 32 is configured to store configuration data transmitted from a cloud service 106. The control module 31 is configured to retrieve the configuration data from the DDR storage module 32 and to configure a corresponding processing unit 104 in user logic 304 of the FPGA 302 according to the configuration data.

In one embodiment, to configure each processing unit 104 in the user logic 304 internal to the FPGA 302, a user can store the configuration data in the DDR storage module 32 external to the FPGA 302 by means of cloud service 106 first. Then, the control module 31 internal to the FPGA 302 retrieves the configuration data from the DDR storage module 32 and configures each processing unit 104 in the user logic 304 internal to the FPGA 302 according to the retrieved configuration data. Control module 31 can configure the configuration data to the corresponding processing unit 104 via a configuration bus internal to the user logic 304. The solution provided by the illustrated embodiment can be directly deployed in an existing FGPA static region structure and does not conflict with an existing MMIO method.

Further, in some embodiments, control module 31 can be further configured to monitor the DDR storage module 32 in real-time. The control module 31 can then retrieve incremental data of the configuration data from the DDR storage module 32 and configure the corresponding processing unit 104 in the user logic 304 according to the incremental data of the configuration data.

In one embodiment, control module 31 can monitor changes in the configuration data in the DDR storage module 32 in real-time. When the incremental data of the configuration data is generated, control module 31 retrieves the incremental data of the configuration data from the DDR storage module 32 in real-time and configures the corresponding processing unit 104 in the user logic 304 according to the incremental data.

In one embodiment, the configuration data can be configured to be in a common register configuration format. The configuration data can include, but is not limited to, one or more of a register address, a register value, and an attribute identifier. The register address is a space offset address of a register of the processing unit. The register value is a value configured to the corresponding register. The attribute identifier is used to identify a read/write attribute configured to the corresponding register. For ease of management, a whole space for storing configuration data can be divided into a fixed number of address combinations, and a user determines to use one or all of them according to actual requirements.

The FPGA 302 can divide a storage region in the DDR storage module 32. In one embodiment, a small region is used to cache configuration data. The region reserved for the configuration data in the DDR storage module 32 is negligible with respect to the whole space of the DDR storage module 32 and does not affect the requirements of the user logic 304 on the capacity of the DDR storage module 32.

Further, the system for cloud-based configuration of FPGA configuration data provided by the illustrated embodiment can further include a DMA module 33 internal to the FPGA 302. The DMA module 33 can be configured to transmit to the DDR storage module 32 the configuration data transmitted by the user via the cloud service 106, thus achieving high-speed data transmission. The cloud service 106 can be connected to the DMA module 33 by means of a Peripheral Component Interconnect Express (PCIe) interface and can be connected to the DDR storage module 32 external to the FPGA by means of the DMA module 33, thereby forming a data transmission channel. On the one hand, during the configuration of configuration data, the cloud transmits the configuration data to the DDR storage module 32. On the other hand, during data migration, the cloud service 106 is configured to read related data from the DDR storage module 32. During data migration, the configuration data and cached data stored in the DDR storage module 32 are migrated together with a virtual machine (VM), thereby implementing functions such as downtime backup, load balancing, etc.

In the illustrated embodiment, a system 300 for cloud-based configuration of FPGA configuration data is provided, where control module 31 is provided internal to the FPGA 302. The control module 31 retrieves configuration data from the storage module 32 external to the FPGA 302 and configures the corresponding processing unit 104 of the FPGA 302. Accordingly, during FPGA data migration, the configuration data stored in the external storage module 32 can be directly migrated by using a general data migration method, thereby implementing live migration of FPGA data. On the one hand, system operation maintenance is facilitated. On the other hand, reconfiguration of each processing unit can be avoided after each FPGA migration, thereby reducing the workload on a user, and improving the user experience.

Figure 4:
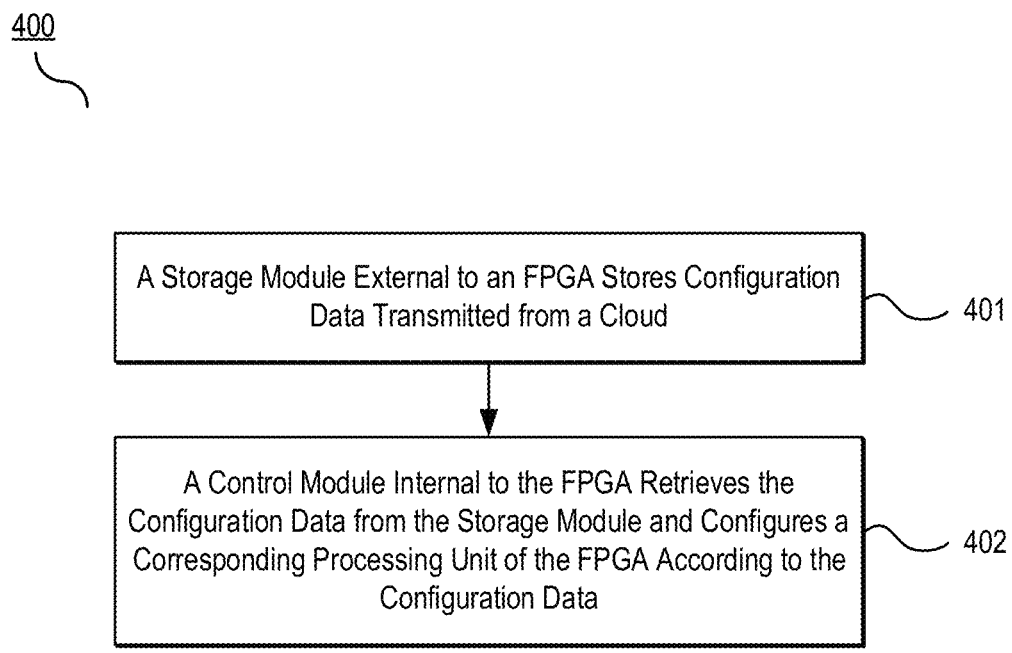
FIG. 4 is a flow diagram illustrating a method for cloud-based configuration of FPGA configuration data according to some of the disclosed embodiments.

FIG. 4 is a flow diagram illustrating a method (400) for cloud-based configuration of FPGA configuration data according to some embodiments. In one embodiment, the method can be performed by the system for the cloud-based configuration of FPGA configuration data. As shown in FIG. 4, the method (400) for cloud-based configuration of FPGA configuration data includes the following steps.

Step 401: A storage module external to an FPGA stores configuration data transmitted from a cloud. In one embodiment, the storage module can receive and store, via a DMA module, the configuration data transmitted from the cloud to implement high-speed data transmission.

Step 402: A control module internal to the FPGA retrieves the configuration data from the storage module and configures a corresponding processing unit of the FPGA according to the configuration data.

In one embodiment, to configure the FPGA of which configuration data is stored in a latched manner, a user can first store the configuration data in the storage module external to the FPGA by means of a cloud, and then the control module internal to the FPGA retrieves the configuration data from the storage module 12 and configures each processing unit of the FPGA according to the retrieved configuration data.

Further, the control module can further monitor the storage module in real-time, retrieve incremental data of the configuration data from the storage module, and configure the corresponding processing unit according to the incremental data of the configuration data.

In one embodiment, the control module can monitor changes in the configuration data in the storage module in real-time, and when incremental data of the configuration data is generated, the control module can retrieve the incremental data of the configuration data from the storage module in real-time and configure the corresponding processing unit according to the incremental data.

Specifically, the configuration data can be configured to be in a common register configuration format. The configuration data can include a register address, a register value, and an attribute identifier. The register address is a space offset address of a register of the processing unit. The register value is a value configured to the corresponding register. The attribute identifier is used to identify a read/write attribute configured to the corresponding register. For ease of management, a whole space for storing configuration data can be divided into a fixed number of address combinations, and a user determines to use one or all of them according to actual requirements.

In the method for cloud-based configuration of FPGA configuration data provided by the embodiment of the present invention, the control module is provided internal to the FPGA to retrieve configuration data from the storage module external to the FPGA and to configure the corresponding processing unit of the FPGA. Accordingly, during FPGA data migration, the configuration data stored in the external storage module can be directly migrated by using a general data migration method, thereby implementing live migration of FPGA data. On the one hand, system operation maintenance is facilitated. On the other hand, reconfiguration of each processing unit can be avoided after each FPGA migration, thereby reducing the workload on a user, and improving the user experience.

The internal functions and structure for cloud-based configuration of FPGA configuration data have been described above, and the system can be embodied as an electronic device.

Figure 5:
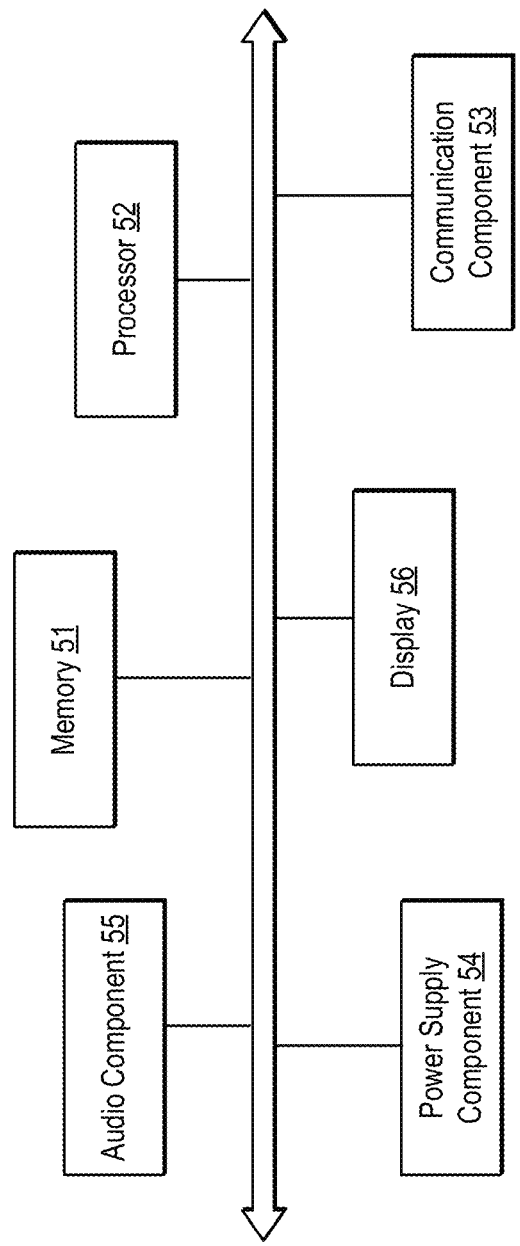
FIG. 5 is a block diagram illustrating an electronic device according to some of the disclosed embodiments.

FIG. 5 is a block diagram illustrating an electronic device (500) according to the present invention. As shown in FIG. 5, the electronic device includes a memory 51 and a processor 52.

Memory 51 is configured to store a program. In addition to the program above, memory 51 may be further configured to store various other data to support operations on the electronic device. Examples of the data include instructions for any application or method operating on the electronic device, contact data, phonebook data, messages, pictures, videos, etc.

Memory 51 may be implemented by any type of volatile or non-volatile storage device or a combination thereof, such as a Static Random-Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, a magnetic disk, or an optical disc.

The processor 52 is coupled to memory 51 and executes the program stored in memory 51, to store, by a storage module external to an FPGA, configuration data transmitted from a cloud; and retrieve, by a control module internal to the FPGA, the configuration data from the storage module and configure a corresponding processing unit of the FPGA according to the configuration data.

Further, as shown in FIG. 5, the electronic device may further comprise: a communication component 53, a power supply component 54, an audio component 55, a display 56, and other components. FIG. 5 only schematically shows some components and does not mean that the electronic device comprises only the components shown in FIG. 5.

The communication component 53 is configured to facilitate wired or wireless communication between the electronic device and other devices. The electronic device can access a wireless network based on a communication standard, such as wireless fidelity (Wi-Fi), 2G, 3G, 4G, 5G, or a combination thereof. In one exemplary embodiment, the communication component 53 receives broadcast signals or broadcast-related information from an external broadcast management system via a broadcast channel. In one exemplary embodiment, the communication component 53 further comprises a near-field communication (NFC) module to facilitate short-range communication. For example, the NFC module may be implemented based on a radio frequency identification (RFID) technology, an Infrared Data Association (IrDA) technology, an ultra-wideband (UWB) technology, a Bluetooth (BT) technology, and other technologies.

The power supply component 54 supplies power to various components of the electronic device. The power supply component 54 may comprise a power management system, one or a plurality of power sources, and other components associated with the generation, management, and distribution of power for the electronic device.

The audio component 55 is configured to output and/or input audio signals. For example, the audio component 55 comprises a microphone configured to receive an external audio signal when the electronic device is in an operating mode, such as a calling mode, a recording mode, and a voice recognition mode. The received audio signals can be further stored in memory 51 or sent via the communication component 53. In some embodiments, the audio component 55 further comprises a speaker configured to output the audio signal.

The display 56 may comprise a screen comprising a Liquid Crystal Display (LCD) and a Touch Panel (TP). If the screen includes the touch panel, then the screen may be implemented as a touch screen to receive input signals from a user. The touch panel includes one or a plurality of touch sensors to sense touches, swipes, and gestures on the touch panel. The touch sensors may sense not only a boundary of a touch or swipe action but also detect a period of time and a pressure related to the touch or swipe operation.

Those skilled in the art can understand that all or part of the steps for implementing the method in the above embodiments can be accomplished by hardware related to program instructions. The program may be stored in a computer-readable storage medium. In execution, the program executes the steps of the method in the above embodiments, and the foregoing storage medium includes various mediums that can store program codes, such as a ROM, a RAM, a magnetic disk, or an optical disc.

It should be finally noted that the above embodiments are merely used for illustrating rather than limiting the technical solutions of the present invention. Although the present application is described in detail with reference to the foregoing embodiments, those of ordinary skill in the art should understand that the technical solutions recorded in the foregoing embodiments may still be modified, or equivalent replacement may be made on part or all the technical features therein. These modifications or replacements will not make the essence of the corresponding technical solutions be departed from the scope of the technical solutions in the embodiments of the present invention.

What is claimed is:

1. A system comprising:
   a field-programmable gate array (FPGA) that comprises a control module, a Direct Memory Access (DMA) module, and a processing unit (PU), the FPGA external to and in communication with a storage module;
   the DMA module configured to transmit configuration data to the storage module from a cloud service;
   the control module configured to retrieve the configuration data from the storage module; and
   the FPGA further configured to configure the PU according to the configuration data.

2. The system of claim 1, wherein the control module is further configured to:
   monitor the storage module;
   retrieve incremental data associated with the configuration data from the storage module; and
   configure the PU according to the incremental data.

3. The system of claim 1, wherein the configuration data comprises data selected from the group consisting of a register address, a register value, and an attribute identifier.

4. The system of claim 3, wherein a register address comprises a space offset address of a register of the PU.

5. The system of claim 3, wherein a register value comprises a value to write to a register.

6. The system of claim 3, wherein an attribute identifier comprises an identifier used to identify a read/write attribute of a register.

7. The system of claim 1, wherein the FPGA further comprises: a Direct Memory Access (DMA) module, wherein the DMA module is configured to transmit the configuration data to the storage module.

8. The system of claim 1, wherein the FPGA is further configured to divide a storage region in the storage module into a first and second region and use the first region for storing the configuration data, the first region having a size smaller than a size of the second region.

9. The system of claim 1, wherein the control module and the PU are located in a static region of the FPGA.

10. The system of claim 9, wherein the DMA module is located outside of the static region of the FPGA.

11. The system of claim 1, wherein the FPGA includes a second PU and the control module is further configured to configure the second PU based on the configuration data.

12. A method comprising:
transmitting, by a direct memory address (DMA) module internal to field-programmable gate array (FPGA), configuration data to a storage module external to an FPGA, the configuration data retrieved from a cloud service;
retrieving, by a control module internal to the FPGA, the configuration data from a storage module external to an FPGA; and
configuring, by the control module, a processing unit (PU) internal to the FPGA according to the configuration data.

13. The method of claim 12, further comprising:
monitoring, by the control module, the storage module;
retrieving, by the control module, incremental data associated with the configuration data from the storage module; and
configuring, by the control module, the PU according to the incremental data.

14. The method of claim 12, wherein storing the configuration data comprises storing data selected from the group consisting of a register address, a register value, and an attribute identifier.

15. The method of claim 12, further comprising dividing a storage region in the storage module into a first and second region and use the first region for storing the configuration data, the first region having a size smaller than a size of the second region.

16. The method of claim 12, further comprising configuring, by the control module, a second PU internal to the FPGA based on the configuration data.

17. A non-transitory computer-readable storage medium for tangibly storing computer program instructions capable of being executed by a computer processor, the computer program instructions defining steps of:
transmitting, by a direct memory address (DMA) module internal to field-programmable gate array (FPGA), configuration data to a storage module external to an FPGA, the configuration data retrieved from a cloud service;
retrieving, by a control module internal to the FPGA, the configuration data from the storage module; and
configuring, by the control module, a processing unit (PU) internal to the FPGA according to the configuration data.

18. The non-transitory computer-readable storage medium of claim 17, the steps further comprising:
monitoring, by the control module, the storage module;
retrieving, by the control module, incremental data associated with the configuration data from the storage module; and
configuring, by the control module, the PU based on the incremental data.

19. The non-transitory computer-readable storage medium of claim 17, wherein storing configuration data comprises storing data selected from the group consisting of a register address, a register value, and an attribute identifier.

20. The non-transitory computer-readable storage medium of claim 17, wherein the control module and the PU are located in a static region of the FPGA and the DMA module is located outside of the static region of the FPGA.

* * * * *